US007634745B2

(12) United States Patent
Allen et al.

(10) Patent No.: US 7,634,745 B2
(45) Date of Patent: Dec. 15, 2009

(54) METHOD FOR COMPUTING THE CRITICAL AREA OF COMPOUND FAULT MECHANISMS

(75) Inventors: Robert J. Allen, Jericho, VT (US); Sarah C. Braasch, Richmond, VT (US); Mervyn Y. Tan, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 539 days.

(21) Appl. No.: 11/461,805

(22) Filed: Aug. 2, 2006

(65) Prior Publication Data
US 2008/0127004 A1    May 29, 2008

(51) Int. Cl.
*G06F 17/50* (2006.01)
(52) U.S. Cl. .............................. 716/4; 716/5
(58) Field of Classification Search ................. 716/4–5, 716/18; 703/13, 14; 430/5, 30
See application file for complete search history.

(56) References Cited

U.S. PATENT DOCUMENTS

| 5,386,423 | A | 1/1995 | Koo et al. |
| 6,044,208 | A | 3/2000 | Papadopoulou et al. |
| 6,066,179 | A * | 5/2000 | Allan ............................ 716/4 |
| 6,178,539 | B1 * | 1/2001 | Papadopoulou et al. ........ 716/7 |
| 6,247,853 | B1 | 6/2001 | Papadopoulou et al. |
| 6,317,859 | B1 | 11/2001 | Papadopoulou |
| 6,775,816 | B2 | 8/2004 | Sato et al. |
| 6,948,141 | B1 | 9/2005 | Satya et al. |
| 7,143,371 | B2 * | 11/2006 | Allen et al. ..................... 716/4 |
| 7,404,159 | B2 * | 7/2008 | Allen et al. ..................... 716/4 |
| 2005/0168731 | A1 | 8/2005 | Shibuya et al. |
| 2005/0240839 | A1 | 10/2005 | Allen et al. |

FOREIGN PATENT DOCUMENTS

| JP | 06-044208 | A | 2/1994 |
| JP | 06-178539 | A | 6/1994 |
| JP | 06-247853 | A | 9/1994 |
| JP | 06-317859 | A | 11/1994 |

OTHER PUBLICATIONS

Ferris-Prabhu, "Method for Design of Structures Having Any DE4SIRED Critical Area," TDB 11-82, BU8810139, Nov. 1982, p. 3113-3115, 2 pages total.

* cited by examiner

*Primary Examiner*—Thuan Do
*Assistant Examiner*—Nghia M Doan
(74) *Attorney, Agent, or Firm*—Gibb I.P. Law Firm, LLC; Richard M. Kotulak, Esq

(57) ABSTRACT

In embodiments of a method critical area is calculated based on both independent and dependent compound fault mechanisms. Specifically, critical area is calculated by generating, for each simple fault mechanism in the compound fault mechanism, a map made up of polygonal regions, where values on a third dimensional z-axis represent the critical defect size for each single fault mechanism at a point x,y. These maps are overlaid and the planar faces (i.e., top surfaces) of each region of each map are projected onto the x,y plane in order to identify intersecting sub-regions. The dominant fault mechanism within each sub-region is identified based on an answer to predetermined Boolean expression and the critical areas for all of the sub-regions are accumulated in order to obtain the total critical area for the compound fault mechanism.

16 Claims, 6 Drawing Sheets

METHOD FOR COMPUTING THE CRITICAL AREA OF COMPOUND FAULT MECHANISMS

BACKGROUND

1. Field of the Invention

The embodiments of the invention generally relate to calculating critical area, and, more particularly, to calculating critical area of compound fault mechanisms.

2. Description of the Related Art

Critical area is a metric used to determine the sensitivity of a circuit layout to random defects that occur during the manufacturing process. It is a function of the critical defect size at every point and the defect density function. Specifically, $$CriticalArea = \int_{xy} \int_{CriticalDefectSize(x,y)}^{\infty} DefectDensity(r) \, dr \, dx \, dy$$

The DefectDensity function is a measure of the probability that a random-defect of a particular size r will occur on the chip. It is design-independent and determined by the manufacturing process. The CriticalDefectSize function is the smallest size of the defect centered at a given point (x, y) that would cause an electrical fault. This function is design-dependent. Critical area can be measured based on the particular way a defect causes an electrical fault in the chip (i.e., based on the type of fault mechanism caused by a defect). Exemplary simple fault mechanisms include opens (i.e., wire breaks), shorts, touches and via blockages.

Compound fault mechanisms occur when faults are dependent on the occurrence of two or more independent or dependent faults. Compound fault mechanisms comprising two or more independent faults include, for example, "opens with contacts", "opens without contacts", and "opens and contacts." "Opens with contacts" is a compound fault mechanism in which defects cause a break in a wire OR a via blockage. "Opens without contacts" is a compound fault mechanism in which defects cause a break in a wire but NOT a via blockage. "Opens and contacts" is a compound fault mechanism in which defects cause a break in a wire AND a via blockage at the same time. In general one can compose these compound fault mechanisms by using AND, OR, and NOT relational operators over the simple fault mechanisms. Compound fault mechanisms dependent on the occurrence of two or more dependent faults include, for example, n-level fault mechanisms such as "double-shorts." "Double-shorts" is a fault mechanism in which a defect must touch two electrically distinct features on two different design levels in order to cause a failure.

Voronoi-based techniques have been used to compute critical area for the simple defect mechanisms based on the design (e.g., as illustrated in the following U.S. patents incorporated herein by reference: U.S. Pat. No. 6,044,208 issued to Papadopoulou et al. on Mar. 28, 2000; U.S. Pat. No. 6,178,539 issued to Papadopoulou et al. on Jan. 23, 2001; U.S. Pat. No. 6,247,853 issued to Papadopoulou et al. on Jun. 19, 2001; and U.S. Pat. No. 6,317,859 issued to Papadopoulou et al. on Nov. 13, 2001). Voronoi-based techniques have further been used to compute compound fault mechanisms comprising independent fault mechanisms (e.g., as illustrated in U.S. Patent Application Pub. No. 2005/0240839 of Allen et al., also incorporated herein by reference). However, the Voronoi-based techniques for computing compound fault mechanisms comprising independent fault mechanism are quite complex. Additionally, these prior art techniques can not be used to compute critical area based on n-level fault mechanisms, such as double-shorts fault mechanisms, because such fault mechanisms are not generally expressible as a composition of other known simple fault mechanisms using only Boolean relations.

Therefore, there remains a need in the art for an improved Voronoi-based technique for more efficiently calculating and detecting the total critical area of a compound fault mechanism, regardless of whether it is independent or dependent in order to improve yield prediction

SUMMARY

In view of the foregoing, disclosed herein are embodiments of an improved Voronoi-based method of calculating and detecting the total critical area of a compound fault mechanism to improve yield prediction for an integrated circuit design.

An embodiment of the method comprises providing a design for an integrated circuit (i.e., a circuit layout), which inherently includes information upon which the critical area of fault mechanisms, including compound fault mechanisms, can be determined. The compound fault mechanisms relevant to this embodiment of the invention can comprise a plurality of simple fault mechanisms (e.g., shorts, opens, touches, via blockages, etc.) that are independent.

Maps can be generated to represent the simple fault mechanisms within a compound fault mechanism (i.e., one map corresponding to each simple fault mechanism contained within a compound fault mechanisms) and each of these maps can be divided into regions. For example, a Voronoi diagram corresponding to each simple fault mechanism can be generated such that each region within the map comprises a polygon having a $3^{rd}$ dimensional z-axis that represents critical defect size.

Once generated, these maps can be overlaid in order to identify sub-regions that represent intersections between the regions of the maps.

Based on the z-axis values within the polygonal regions of each map that intersect in a given sub-region, the dominant fault mechanism for that given sub-region can be determined from amongst the various fault mechanisms mapped within that sub-region. Specifically, the dominant fault mechanism for each sub-region can be determined based on predetermined relational operator(s) that are to be applied among the fault mechanisms (e.g., an AND, OR, or NOT relational operator to be applied between the first and second fault mechanisms).

For example, if the relational operator comprises OR then, the dominant fault mechanism can comprise that fault mechanism which corresponds to the lowest of the regions along the z-axis within each sub-region. Alternatively, if the relational operator comprises AND then, the dominant fault mechanism can comprise that fault mechanism which corresponds to the highest of the regions along the z-axis within each sub-region.

Once determined, the dominant fault mechanisms for each sub-region can then be used to determine the critical area associated with each sub-region and the critical areas of each sub-region can be accumulated in order to compute the overall critical area for the compound fault mechanism.

Another embodiment of the method also comprises providing a design for an integrated circuit (i.e., a circuit layout), which inherently information upon which the critical area of multiple fault mechanisms, including compound fault mechanisms, can be determined. The compound fault mechanisms relevant to this embodiment of the invention can comprise shorts, opens, via blockages, and/or touches that are dependent upon a defect condition.

As with the previously described embodiment, for each of the simple fault mechanisms contained within a compound fault mechanism, a separate map can be generated. Each map can be divided into regions (e.g., a first map comprising a plurality of first regions and representing a first fault mechanism, a second map comprising a plurality of second regions and representing a second fault mechanism, etc.). For example, Voronoi diagrams corresponding to each of the simple fault mechanisms can be generated such that each region within each map comprises a polygon having a $3^{rd}$ dimensional z-axis that represents critical defect size Once generated, these maps can be overlaid in order to identify sub-regions that represent intersections between the regions of the various maps.

Then, based on the z-axis values within the polygonal regions of each map that intersect in a given sub-region as well as on additional design information contained in the circuit layout (e.g., information regarding whether the defects involved in the various fault mechanisms contact either the same net or different nets on the same or different levels), the dominant fault mechanism for that given sub-region can be determined from amongst the various fault mechanisms mapped within that sub-region.

That is, in order to determine the dominant fault mechanism in a given sub-region, conditionals are determined based on information contained in the circuit design. Based on these conditionals, at least one relational operator to be applied between the fault mechanisms is determined and that relational operator is used to determine the dominant fault mechanism.

More specifically, a defect condition (e.g., whether or not a defect contacts shapes on the same or different nets) is determined and alternate conditional formulas (i.e., Boolean expressions) are generated to indicate which of the intersecting regions along the z-axis within a given sub-region should correspond to the dominant fault mechanism.

The application of one of the alternate formulas over is dependent upon the previously identified defect condition.

Once determined, the dominant fault mechanisms for each sub-region can then be used to determine the critical area associated with each sub-region and the critical areas of each sub-region can be accumulated in order to compute the overall critical area for the compound fault mechanism.

In this embodiment double shorts can be framed as dependent compound fault mechanisms. The simple fault mechanisms within the double-shorts fault mechanism can be identified as touches on two different levels and shorts on two different levels (e.g., a first level touch, second level touch, first level short and second level short).

The process of generating maps can comprise generating a first map corresponding to the first level touch and comprising a plurality of first regions, a second map corresponding to the second level touch and comprising a plurality of second regions, a third map corresponding to the first level shorts and comprising a plurality of third regions, and a fourth map corresponding to the second level shorts and comprising a plurality of fourth region.

The conditional (i.e., defect condition) can be identified as whether the defect contacts either the same net or different nets according to first level touch and second level touch mechanism.

Then, a first alternate formula can be developed which provides that if the defect contacts different nets according to first level touch and second level touch mechanism, then the dominant fault mechanism within any given sub-region with that property will be that fault mechanism which corresponds to the higher of the first region and the second region along the z-axis in the given sub-region. A second alternate formula can be developed which provides that if the defect contacts the same net according to first level touch and second level touch mechanism, then the dominant fault mechanism for any given sub-region comprises that fault mechanism corresponding to the lower of the higher of the first region and the fourth region along the z-axis in the given sub-region and the higher of the second region and the third region along the z-axis in the given sub-region.

The double-shorts critical area for each sub-region can be accumulated to determine the overall double-shorts critical area for the circuit layout. This overall double-shorts critical area can then be used as a building block in the process of computing overall critical area for compound fault mechanisms comprising independent simple fault mechanisms, as in the previously described embodiment.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENT

Figure 1:
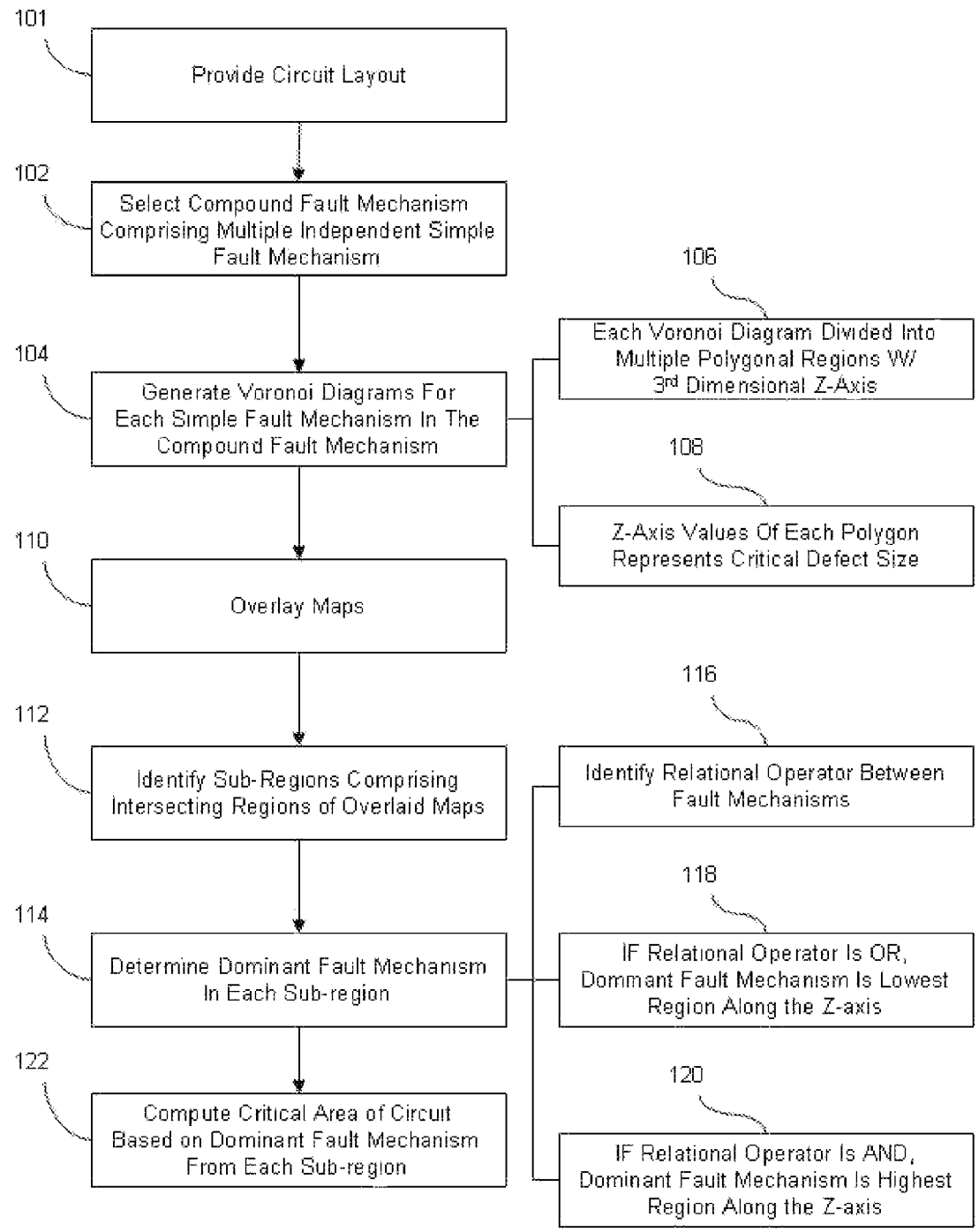
FIG. 1 is a flow diagram illustrating an embodiment of the method of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, critical area is a metric used to determine the sensitivity of a circuit layout to random defects that occur during the manufacturing process. It is a function of the critical defect size at every point and the defect density function. Specifically, $$CriticalArea = \int_{xy}\int_{CriticalDefectSize(x,y)}^{\infty} DefectDensity(r) dr dx dy$$

The DefectDensity function is a measure of the probability that a random-defect of a particular size r will occur on the chip. It is design-independent and determined by the manufacturing process. The CriticalDefectSize function is the smallest size of the defect centered at a given point (x, y) that would cause an electrical fault. This function is design-dependent. Critical area can be measured based on the particular way a defect causes an electrical fault in the chip (i.e., based on the type of fault mechanism caused by a defect). Exemplary simple fault mechanisms include opens (i.e., wire breaks), shorts, touches and via blockages. More specifically, as described in U.S. Patent Application Pub. No. 2005/0240839 of Allen et al., referenced above, simple fault mechanisms include the following fault types: (1) a "touch" type fault, which occurs when a defect (e.g., a particle) touches a conductive feature; (2) a "short" type fault, which occurs when a defect causes a short circuit between two different nets; (3) an "open" type fault, which occurs when there is a break in a wire; and (4) a "via block" type fault which occurs when a defect blocks a via or contact.

Compound fault mechanisms occur when faults are dependent on the occurrence of two or more independent or dependent faults. Compound fault mechanisms comprising two or more independent faults include, for example, "opens with contacts", "opens without contacts", and "opens and contacts." "Opens with contacts" is a compound fault mechanism in which defects cause a break in a wire OR a via blockage. "Opens without contacts" is a compound fault mechanism in which defects cause a break in a wire but NOT a via blockage. "Opens and contacts" is a compound fault mechanism in which defects cause a break in a wire AND a via blockage at the same time. In general one can compose these compound fault mechanisms by using AND, OR, and NOT relational operators over the simple fault mechanisms. Compound fault mechanisms comprising two or more dependent faults include, for example, n-level fault mechanisms. For example, "double-shorts" can be framed as dependent compound fault mechanisms. "Double-shorts" is a fault mechanism in which a defect must touch two electrically distinct features on two different design levels in order to cause a failure.

Voronoi-based techniques have been used to compute critical area for the simple defect mechanisms given the circuit design. Voronoi-based techniques have further been used to compute compound fault mechanisms comprising independent fault mechanisms. However, the Voronoi-based techniques for computing compound fault mechanisms comprising independent fault mechanism are quite complex. Additionally, these prior art techniques can not be used to compute critical area based on n-level fault mechanisms, such as double-shorts fault mechanisms, because such fault mechanisms are not expressible as a composition of other known simple fault mechanisms using only Boolean relations. Thus, there remains a need in the art for an improved Voronoi-based technique for more efficiently calculating and detecting the total critical area based on both independent and dependent compound fault mechanism in order to improve yield prediction Therefore, disclosed herein are embodiments of a method of calculating and detecting the total critical area of a compound fault mechanism to improve yield prediction. The embodiments of the method can be used to calculate the total critical area based on both independent (A or B or C) and dependent (IF CONDITION, then A, else B) compound fault mechanisms. This total critical area is calculated by generating, for each simple fault mechanism (e.g. A, B, C) in a compound mechanism, a critical defect size map (e.g., a Voronoi diagram, where each diagram is made up of polygonal regions and where each polygonal region has a planar face (i.e., a planar top surface) and has a third-dimensional z-Axis with values that represent the critical defect size, for each single fault mechanism at point x,y). These maps are overlaid and the planar faces of each region of each map are projected onto the x,y plane in order to identify intersecting sub-regions. The dominant fault mechanism within each sub-region is identified based on an answer to predetermined Boolean expression and the critical areas for all of the sub-regions are accumulated in order to obtain the total critical area for the compound fault mechanism.

More particularly, referring to FIG. 1, an embodiment of the method comprises providing a design for an integrated circuit (i.e., a circuit layout) (101), which inherently includes information upon which the critical area of multiple fault mechanisms, including compound fault mechanisms, can be determined. This embodiment particularly relates to compound fault mechanisms that comprise a plurality of simple fault mechanisms (e.g., shorts, opens, touches, via blockages, etc., as defined above) that are independent. For illustration purposes, this embodiment is described herein with regard to two simple fault mechanisms within a compound fault mechanism. However, it is anticipated that more than the compound fault mechanism may comprise more than two simple fault mechanisms.

Critical defect size maps can then be generated to represent each of the simple fault mechanisms in a selected compound fault mechanism (i.e., one corresponding map for each of a plurality of fault mechanisms in a selected compound fault mechanism) (102-104). Specifically, each map maps all points in the layout to a critical defect size and is divided into regions, having planar faces (i.e., planar top surfaces) (106). More specifically, each map can comprise a Voronoi type diagram or any other suitable "critical-defect-size map" that consists of planar faces.

Figure 2:
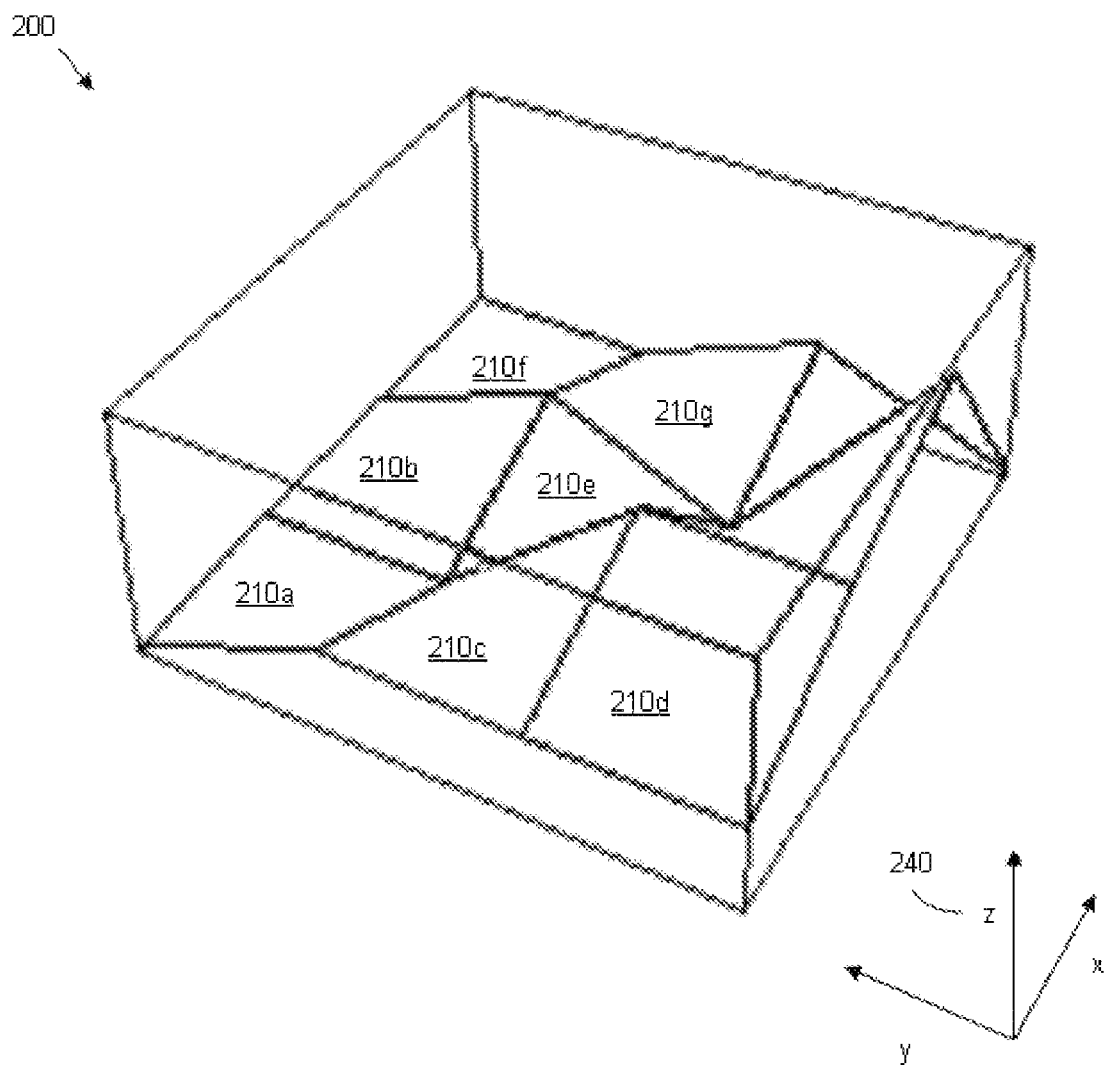
FIG. 2 is a schematic diagram illustrating an exemplary three-dimensional Voronoi diagram.
Figure 3:
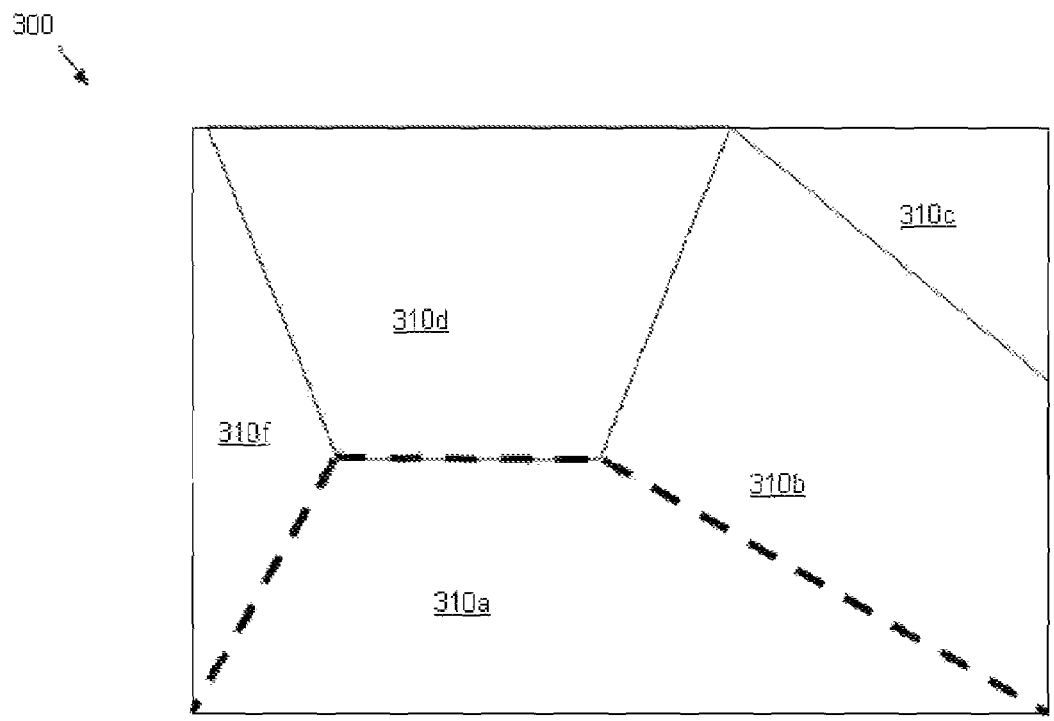
FIG. 3 is a schematic diagram illustrating a top view of a three-dimensional Voronoi diagram 300.
Figure 4:
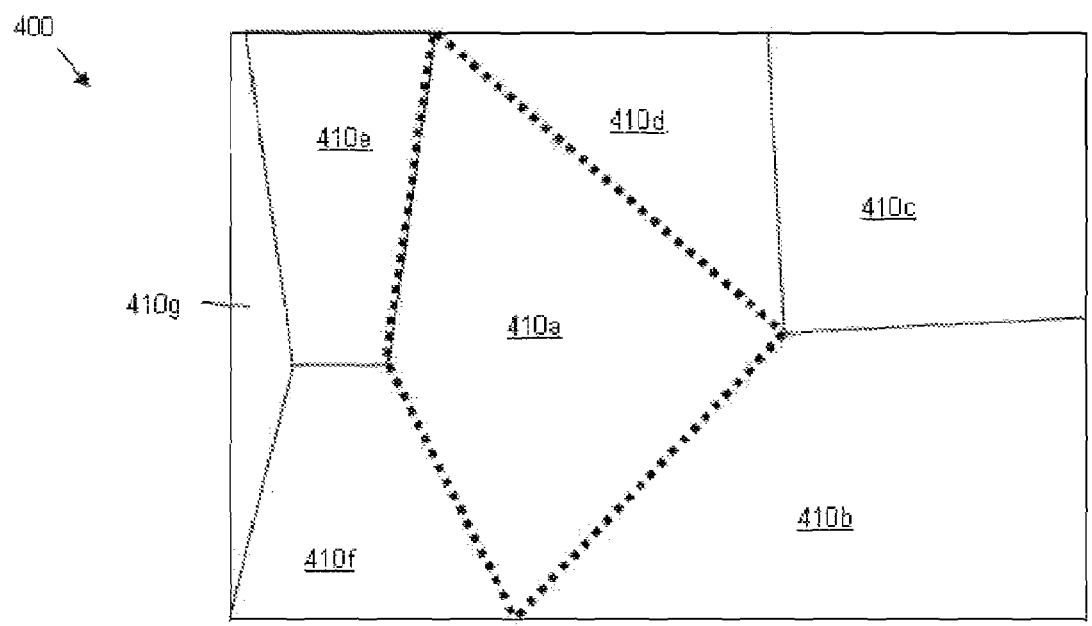
FIG. 4 is a schematic diagram illustrating a top view of another three-dimensional Voronoi diagram 400.

For example, referring to FIG. 2, an exemplary Voronoi diagram 200 can be generated using conventional mapping techniques. Each map can comprise a plurality of polygonal regions 210a-f. Each polygonal region can have a third dimensional z-axis and a planar face (i.e., planar top surface). The faces of each polygonal region can be positioned on the z-axis 240. The z-axis 24 values can represent a critical defect size for the corresponding fault mechanism at a point x,y (108). Thus, a first map 300 for a first fault mechanism can be generated such that it is divided into first regions 310a-f (see the top view of Voronoi diagram 300 of FIG. 3), a second map 400 for a second fault mechanism can be generated such that it is divided into second regions 410a-g (see the top view of Voronoi diagram 400 of FIG. 4), etc.

Figure 5:
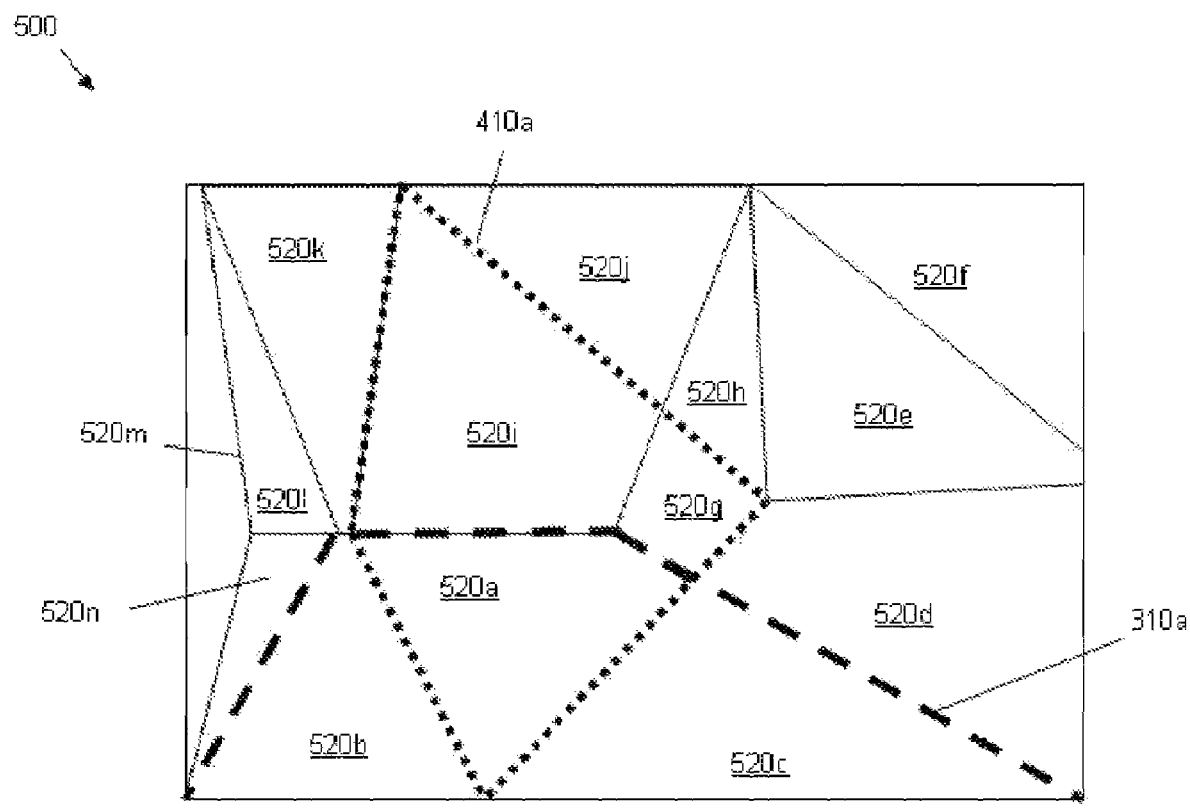
FIG. 5 is a schematic diagram illustrating a top view of an overlay 500 of the diagrams of FIGS. 3 and 4.

Once generated, these maps (e.g., the first map 300, the second map 400, etc.) can be overlaid (110, see top view of overlay 500 of FIG. 5) with the faces of the integrated Voronoi diagrams 300, 400, etc. projected onto the x,y plane (i.e., with the polygonal regions flattened out). This overlay can be performed using well known polygonal or sweepline techniques. Then, sub-regions 520*a-n* are identified that represent the intersections between the faces of the different regions of each map (e.g., intersections between faces of the first regions 310*a-f* of the first map 300, the second regions 410*a-g* of the second map 400, etc.) (112). For example, sub-region 520*a* represents an intersection of the face of the first region 310*a* of first map 300 of FIG. 3 and the face of the second region 410*a* of second map 400 of FIG. 4.

Based on the z-axis values within the polygonal regions (e.g., 310*a*, 410*a*) whose faces intersect in a given sub-region (e.g., 520*a*), the dominant fault mechanism for that given sub-region 520*a* can be determined from amongst the various fault mechanisms mapped (e.g., from amongst the first fault mechanism and the second fault mechanism) by determining an answer to a Boolean expression (114). Specifically, relational operator(s) to be applied amongst the fault mechanisms are predetermined (e.g., an AND, OR, or NOT relational operator to be applied between the first and second fault mechanisms) (116). The dominant fault mechanism in each sub-region can then be determined based on the relational operator.

For example, for fault mechanisms A (i.e., the first fault mechanism) and B (i.e., the second fault mechanism), the following would apply:

CriticalArea(Region(*A* OR *B*))=CriticalArea(Min(Region(*A*), Region(*B*)))=Max(CriticalArea(Region (*A*)), CriticalArea(Region*B*)))

CriticalArea(Region(*A* AND *B*))=CriticalArea(Max (Region(*A*), Region(*B*)))=Min(CriticalArea(Region(*A*)), CriticalArea(Region(*B*)))

CriticalArea(Region(NOT *A*))=2*D*RegionArea−CriticalArea(Region(*A*))

Thus, if the relational operator comprises OR then, the dominant fault mechanism of a given sub-region can comprise that fault mechanism which corresponds to the lowest of the intersecting regions along the z-axis within that sub-region (118). Alternatively, if the relational operator comprises AND then, the dominant fault mechanism of a given sub-region can comprise that fault mechanism which corresponds to the highest of the intersecting regions along the z-axis within that given sub-region (120).

Once determined, the dominant fault mechanisms for each sub-region can then be used (e.g., fed into a formula as illustrated Pub. No. 2005/0240839 of Allen et al., referenced above) in order to determine the critical area that is associated with each sub-region. The critical areas of each sub-region can be accumulated in order to compute the overall critical area for the compound fault mechanism (122) and to, thereby, determine a failure probability value for the chip (i.e., predict yield).

Figure 6:
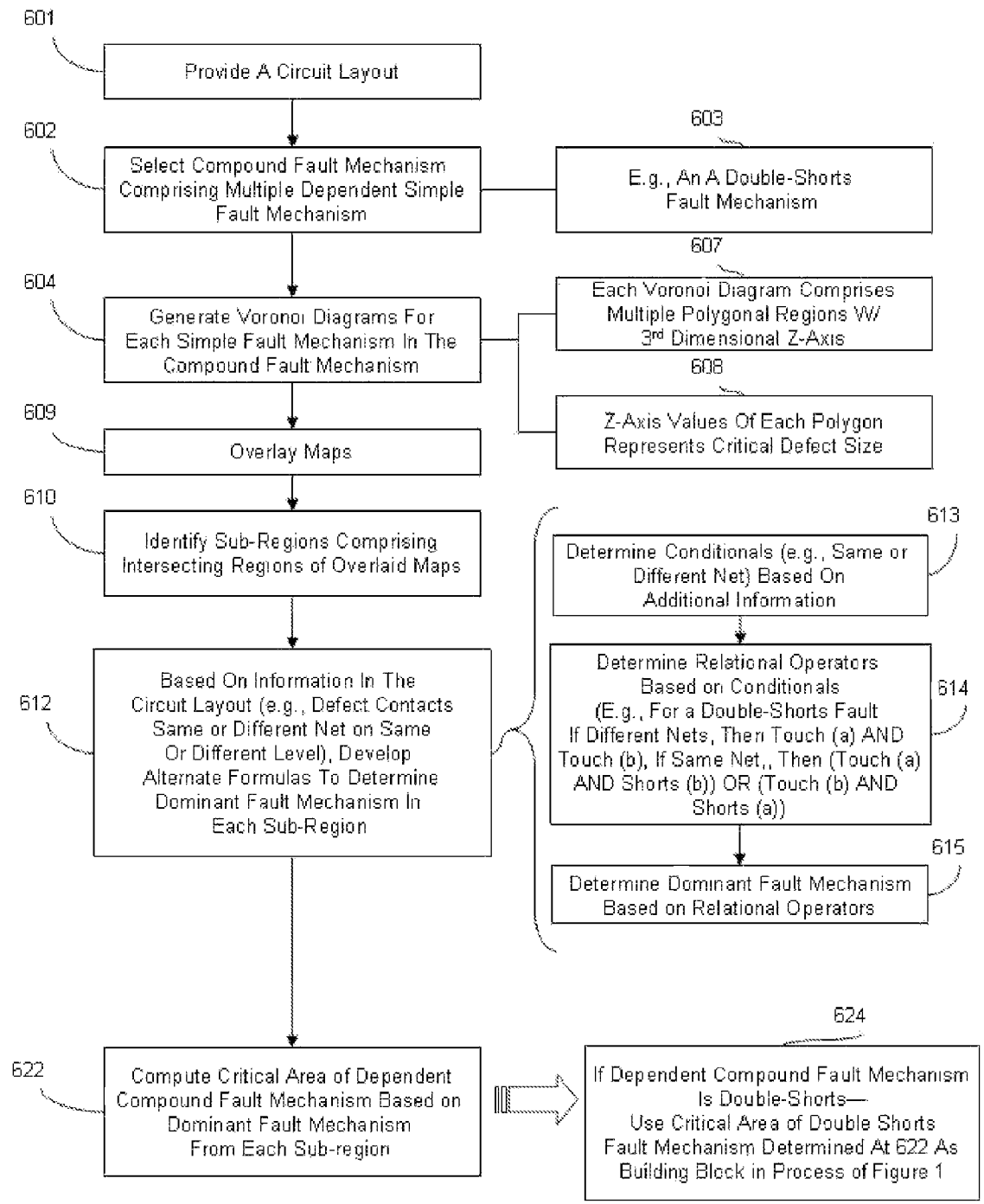
FIG. 6 is a flow diagram illustrating another embodiment of the method of the invention.

Referring to FIG. 6, another embodiment of the method also comprises providing a design for an integrated circuit (i.e., a circuit layout) (601), which inherently includes information upon which the critical area of the fault mechanisms, including compound fault mechanisms, can be determined. This embodiment particularly relates to compound fault mechanisms that comprise a plurality of simple fault mechanisms (e.g., shorts, opens, touches, via blockages, etc., as defined above) that are dependent upon an identified defect condition.

Critical defect size maps can then be generated to represent each of the simple fault mechanisms in a selected compound fault mechanism (i.e., one corresponding map for each of a plurality of fault mechanisms in a selected compound fault mechanism) (602-604). Specifically, each map maps all points in the layout to a critical defect size and is divided into regions, where each region has a third dimensional z-axis representing critical defect size (608) and a planar face (i.e., planar top surface) (607). More specifically, each map can comprise a Voronoi type diagram or any other suitable "critical-defect-size map" that consists of planar faces.

For example, referring to FIG. 2, an exemplary Voronoi diagram 200 can be generated using conventional mapping techniques. Each map can comprise a plurality of polygonal regions 210*a-f*, where each polygonal region has a third dimensional z-axis (608) and has a planar face (i.e., planar top surface) (607). Each planar face can have a position on the z-axis 240 that represents a critical defect size for the corresponding fault mechanism at a point x,y (608). Thus, a first map 300 for a first fault mechanism can be generated such that it is divided into first regions 310*a-f* (see the top view of Voronoi diagram 300 of FIG. 3), a second map 400 for a second fault mechanism can be generated such that it is divided into second regions 410*a-g* (see the top view of Voronoi diagram 400 of FIG. 4), etc.

Once generated, these maps can be overlaid in order to identify sub-regions that represent intersections between the regions of each map (e.g., intersections between the first regions of the first map and the second regions of the second map) (609-610). This overlay process can be accomplished in the same manner described above with regard to process 110 of FIG. 1.

Then, based on the z-axis values within the polygonal regions of each map that intersect in a given sub-region as well as on additional design information contained in the circuit layout (e.g., information regarding whether defects involved in the various fault mechanisms contact either the same net or different nets on the same or different levels), the dominant fault mechanism for that given sub-region can be determined from amongst the various fault mechanisms mapped within that sub-region (612).

That is, in order to determine the dominant fault mechanism in a given sub-region, conditionals (e.g., Does the defect contact shapes on the same or different net? Does the defect contact shapes on the same or different level?, etc.) are determined based on information contained in the circuit design (613). Based on these conditionals, at least one relational operator to be applied among the fault mechanism is determined (614) and that at least one relational operator is used to determine the dominant fault mechanism (615).

More specifically, a defect condition (i.e., a conditional) can be identified (e.g., Does the defect contacts shapes on either the same net or on different nets?) at process 613. Then, alternate formulas (i.e., alternate Boolean expressions) can be generated (614) based on the conditionals in order to indicate which of the intersecting regions along the z-axis within a given sub-region should correspond to the dominant fault mechanism (615).

For example, a first formula comprising at least one first relational operator between two or more of the simple fault mechanisms can be developed as can an alternate second formula comprising at least one second relational operator between two or more of the simple fault mechanisms. The application of one of the alternate formulas over another (e.g., the application of the first formula as opposed to the second formula) to determine the dominant fault mechanism (at process 612) can be made dependent upon the previously identified defect condition (e.g., can be dependent upon whether or not the defect contacts shapes on the same net or contacts shapes on different nets).

Once determined, the dominant fault mechanisms for each sub-region can then be used to determine the critical area associated with each sub-region and the critical areas of each sub-region can be accumulated in order to compute the overall critical area for the dependent fault compound fault mechanism (622).

In order to determine the critical area of a double-shorts fault mechanism, described above, the double-shorts can be framed as dependent compound fault mechanisms. For example, the four simple fault mechanisms within the double-shorts fault mechanism can be identified as touches on two different levels and shorts on two different levels (e.g., a first level touch, second level touch, first level short and second level short). The process 604 of generating maps can comprise generating a first map corresponding to the first level touch and comprising a plurality of first regions, a second map corresponding to the second level touch and comprising a plurality of second regions, a third map corresponding to the first level shorts and comprising a plurality of third regions, and a fourth map corresponding to the second level shorts and comprising a plurality of fourth region.

The defect condition (i.e., conditionals) upon which the critical area of the double shorts fault mechanism is dependent can be identified (at process 613) as whether the defect contacts either the same net or different nets, according to first level touch and second level touch mechanism.

Then, the following alternate formulas can be developed at process 614 based on the touches and shorts faults for the different levels A and B that are affected by the double shorts fault mechanism:

---

DoubleShorts(A, B) = IF (Touch(A) is on different net than Touch(B))
    THEN (Touch(A) AND Touch(B))
    ELSE ((Touch(A) AND Shorts(B)) OR (Touch(B) AND Shorts(A))

---

That is, the first alternate formula provides that if the defect contacts different nets, according to first level touch and second level touch mechanism, then the dominant fault mechanism within any given sub-region with that property will be that fault mechanism which corresponds to the higher of the first region and the second region along the z-axis in the given sub-region (i.e., (Touch(A) AND Touch(B)). The second alternate formula provides that if the defect contacts the same net, according to first level touch and second level touch mechanism, then the dominant fault mechanism for any given sub-region comprises that fault mechanism corresponding to the lower of the higher of the first region and the fourth region along the z-axis in the given sub-region and the higher of the second region and the third region along the z-axis in the given sub-region (i.e., ((Touch(A) AND Shorts(B)) OR (Touch(B) AND Shorts(A)). These alternate formulas may then be applied (as described above with regard to processes 116-120) to determine the dominant fault mechanism. That is, if the relational operator comprises OR then, the dominant fault mechanism of a given sub-region can comprise that fault mechanism which corresponds to the lowest of the intersecting regions along the z-axis within that sub-region. Alternatively, if the relational operator comprises AND then, the dominant fault mechanism of a given sub-region can comprise that fault mechanism which corresponds to the highest of the intersecting regions along the z-axis within that given sub-region.

Once determined, the dominant fault mechanisms for each sub-region can then be used to determine the critical area of double-shorts associated with each sub-region, which can be accumulated in order to compute the overall double critical area for the compound fault mechanism (e.g., a double shorts fault mechanism) (622). This computation process can be accomplished in the same manner described above with regard to process 122 of FIG. 1.

Furthermore, once the dominant fault mechanisms for each sub-region in the double-shorts fault mechanism is determined, this information may be used as a building block in an independent compound fault schema to define a whole new space of fault mechanisms (e.g., n-level shorts where a defect causes an electrical fault when it touches N shapes on N different levels that are not all on the same net (624).

The embodiments of the invention can take the form of an entirely hardware embodiment, an entirely software embodiment or an embodiment including both hardware and software elements. In a preferred embodiment, the invention is implemented in software, which includes but is not limited to firmware, resident software, microcode, etc.

Furthermore, the embodiments of the invention can take the form of a computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (I/O) devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

Figure 7:
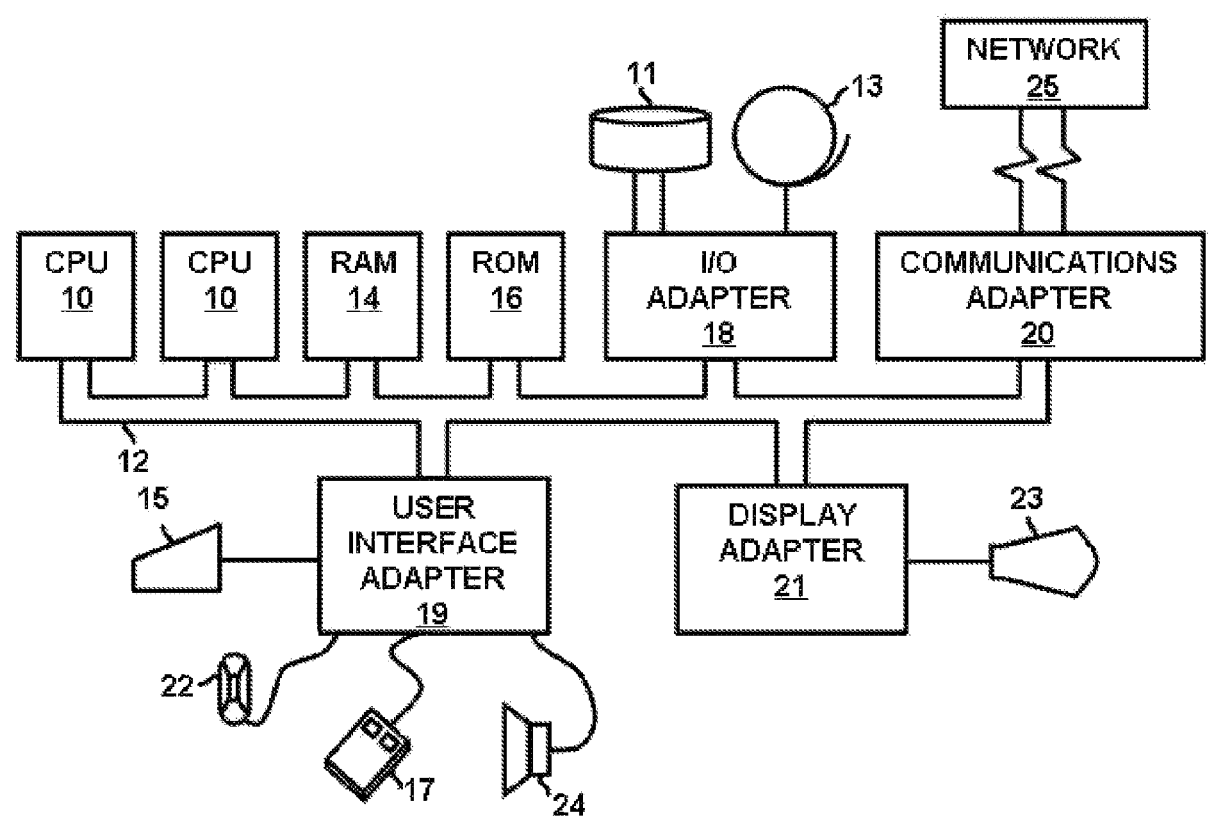
FIG. 7 is a schematic diagram illustrating a hardware embodiment of the invention.

A representative hardware environment for practicing the embodiments of the invention is depicted in FIG. 7. This schematic drawing illustrates a hardware configuration of an information handling/computer system in accordance with the embodiments of the invention. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments of the invention. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

The embodiments of the method, described above, use Boolean expressions to describe a compound fault mechanism in order to yield a specific answer within certain regions of the design and accumulate these answers to determine the total critical area for the design. These embodiments have advantages over the prior art because they propagates data from the physical design to produce a more accurate yield probability value and use a fewer number of process steps because the prior art methods require generating additional Voronoi diagrams for all possible combinations of compound faults, not just each single fault mechanism. Additionally, the embodiments of the method are generally easier to implement and potentially faster than the prior art methods. Furthermore, the embodiments of the method do not require the construction of Voronoi diagrams per se but can use any type of "critical-defect-size map" that consists of planar faces.

Therefore, the embodiments of the method, described above, allow for the computation of the total critical area for any compound fault mechanism in order to improve yield prediction, regardless of whether the simple fault mechanisms are independent or dependent (i.e., involve conditionals over defect-related attributes (e.g., a net)). The critical area is calculated by generating, for each simple fault mechanism in the compound mechanism, a critical defect sizes map made up of three-dimensional polygonal regions, where the z-axis values represents the critical defect size for each single fault mechanism at a point x,y. These maps are overlaid and the planar faces of each region of each map are projected onto the x,y plane in order to identify intersecting sub-regions. The dominant fault mechanism within each sub-region is identified based on an answer to predetermined Boolean expression and the critical areas for all of the sub-regions are accumulated in order to obtain the total critical area for the compound fault mechanism.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, those skilled in the art will recognize that the embodiments of the invention can be practiced with modification within the spirit and scope of the appended claims.

What is claimed is:

1. A method of calculating critical area of a compound fault mechanism in an integrated circuit design, said method comprising:

generating, by a computer system, maps, wherein each map comprises a three-dimensional diagram that represents a single one of multiple simple fault mechanisms within said compound fault mechanism and wherein said map is divided into regions;

overlaying, by said computer system, said maps in order to identify sub-regions that represent intersections between said regions of said maps;

identifying, by said computer system, a dominant fault mechanism from amongst any of said multiple simple fault mechanisms in each of said sub-regions based on the relative locations of said multiple simple fault mechanism along a z-axis representing critical defect size, wherein identification of said dominant fault mechanism is dependent upon a type of relational operator predetermined to be applied between said multiple simple fault mechanism so as to compose said compound fault mechanism, wherein if said predetermined relational operator comprises OR: then said dominant fault mechanism for said sub-region comprises that fault mechanism which corresponds to a lowest of said multiple simple fault mechanisms along said z-axis within said sub-region and wherein if said predetermined relational operator comprises AND, then said dominant fault mechanism for said sub-region comprises that fault mechanism which corresponds to a highest of said multiple simple fault mechanisms along said z-axis within said sub-region; and computing, by said computer system, said critical area of said compound fault mechanism based on an accumulation of critical areas calculated, for each of said sub-regions, using said dominant fault mechanism in each of said sub-regions.

2. The method of claim 1, wherein said generating of said maps comprises generating Voronoi diagrams.

3. The method of claim 1, wherein said multiple simple fault mechanisms comprise at least one of opens, shorts, touches, and via blockages and wherein each of said fault mechanisms is independent.

4. A method of calculating critical area of a compound fault mechanism in an integrated circuit design, said method comprising:

generating, by a computer system, maps, wherein each map comprises a three-dimensional diagram that represents a single one of multiple simple fault mechanisms within said compound fault mechanism and wherein said map is divided into regions;

overlaying, by said computer system, said maps in order to identify sub-regions that represent intersections between said regions of said maps;

identifying, by said computer system, a dominant fault mechanism from amongst any of said multiple simple fault mechanisms in each of said sub-regions based on the relative locations of said multiple simple fault mechanisms along a z-axis representing critical defect size, wherein identification of said dominant fault mechanism within any given sub-region is dependent upon of a type of relational operator selected to be applied between said multiple simple fault mechanisms so as to compose said compound fault mechanism within said given sub-region based on information within said design, said information specifying whether defects involved in said multiple simple fault mechanisms contact a same net or a different net on a same level or a different level in said design, wherein if said predetermined relational operator comprises OR: then said dominant fault mechanism for said sub-region comprises that fault mechanism which corresponds to a lowest of said multiple simple fault mechanisms along said z-axis within said sub-region and wherein if said predetermined relational operator comprises AND, then said dominant fault mechanism for said sub-region comprises that fault mechanism which corresponds to a highest of said multiple simple fault mechanisms along said z-axis within said sub-region; and computing, by said computer system, said critical area of said compound fault mechanism based on an accumulation of critical areas calculated, for each of said sub-regions, using said dominant fault mechanism in each of said sub-regions.

5. The method of claim 4, wherein said generating of said maps comprises generating Voronoi diagrams.

6. The method of claim 5, wherein said determining of said dominant fault mechanism comprises:

determining, based on said information, conditionals;

determining, based on said conditionals, at least one relational operator to be applied among said fault mechanisms; and determining, based on said relational operator, said dominant fault mechanism.

7. The method of claim 6, wherein said multiple simple fault mechanisms comprise at least one of opens, shorts, touches and via blockages, and wherein at least one of said multiple simple fault mechanisms is dependant upon another of said multiple simple fault mechanisms.

8. The method of claim 4, wherein if said compound fault mechanism comprises a double shorts fault mechanism, then:

said multiple simple fault mechanisms comprises a first level touch, a second level touch, a first level short and a second level short;

said generating comprises generating the following maps:

a first map corresponding to said first level touch and comprising a plurality of first regions;

a second maps corresponding to said second level touch and comprising a plurality of second regions;

a third map corresponding to said first level shorts and comprising a plurality of third regions;

a fourth map corresponding to said second level shorts and comprising a plurality of fourth region; and said determining of said dominant fault mechanism within a given sub-region comprises applying a first formula if said first level touch and said second level touch involve different nets and applying a second formula if said first level touch and said second level touch involve a same net, wherein said first formula provides that said dominant fault mechanism comprises that fault mechanism corresponding to a higher of a first region and a second region along said z-axis within said given sub-region, and wherein said second formula provides that said dominant fault mechanism comprises that fault mechanism corresponding to a lower of a higher of a first region and a fourth region along said z-axis within said given sub-region and a higher of a second region and a third region along said z-axis within said given sub-region.

9. A program storage device readable by computer and tangibly embodying a program of instructions executable by said computer to perform a method of calculating critical area of a compound fault mechanism in an integrated circuit design, said method comprising:

generating maps, wherein each map comprises a three-dimensional diagram that represents one of multiple simple fault mechanisms within said compound fault mechanism and wherein said map is divided into regions;

overlaying each of said maps in order to identify sub-regions that represent intersections between said regions of said maps;

identifying a dominant fault mechanism from amongst any of said multiple simple fault mechanism in each of said sub-regions based on the relative locations of said multiple simple fault mechanisms along a z- axis representing critical defect size, wherein identification of said dominant fault mechanism is dependent upon a type of relational operator predetermined to be applied between said multiple simple fault mechanisms so as to compose said compound fault mechanism, wherein if said predetermined relational operator comprises OR: then said dominant fault mechanism for said sub-region comprises that fault mechanism which corresponds to a lowest of said multiple simple fault mechanisms along said z-axis within said sub-region and wherein if said predetermined relational operator comprises AND, then said dominant fault mechanism for said sub-region comprises that fault mechanism which corresponds to a highest of said multiple simple fault mechanisms along said z-axis within said sub-region; and computing said critical area of said compound fault mechanism based on an accumulation of critical areas calculated, for each of said sub-regions, using said dominant fault mechanism in each of said sub-regions.

10. The program storage device of claim 9, wherein said generating of said maps comprises generating Voronoi diagrams.

11. The program storage device of claim 9, wherein said multiple simple fault mechanisms comprises at least one of opens, shorts, touches, and via blockages and wherein each of said fault mechanisms is independent.

12. A program storage device readable by computer and tangibly embodying a program of instructions executable by said computer to perform a method of calculating critical area of a compound fault mechanism in an integrated circuit design, said method comprising:

generating maps, wherein each map comprises a three-dimensional diagram that represents a single one of multiple simple fault mechanisms within said compound fault mechanism and wherein said map is divided into regions;

overlaying said maps in order to identify sub-regions that represent intersections between said regions of said maps;

identifying a dominant fault mechanism from amongst any of said multiple simple fault mechanisms in each of said sub-regions based on the relative locations of said multiple simple fault mechanisms along a z-axis representing critical defect size, wherein identification of said dominant fault mechanism within any given sub-region is dependent upon of a type of relational operator selected to be applied between said multiple simple fault mechanisms so as to compose said compound fault mechanism within said given sub-region based on information within said design, said information specifying whether defects involved in said multiple simple fault mechanisms contact a same net or a different net on a same level or a different level in said design, wherein if said predetermined relational operator comprises OR: then said dominant fault mechanism for said sub-region comprises that fault mechanism which corresponds to a lowest of said multiple simple fault mechanisms along said z-axis within said sub-region and wherein if said predetermined relational operator comprises AND, then said dominant fault mechanism for said sub-region comprises that fault mechanism which corresponds to a highest of said multiple simple fault mechanisms along said z-axis within said sub-region; and computing said critical area of said compound fault mechanism based on an accumulation of critical areas calculated, for each of said sub-regions, using said dominant fault mechanism in each of said sub-regions.

13. The program storage device of claim 12, wherein said generating of each said map comprises generating a Voronoi diagram.

14. The program storage device of claim 12, wherein said determining of said dominant fault mechanism comprises:

determining, based on said information, conditionals;

determining, based on said conditionals, at least one relational operator to be applied among said plurality of fault mechanisms; and determining, based on said relational operator, said dominant fault mechanism.

15. The program storage device of claim 14, wherein said multiple simple fault mechanisms comprise at least one of opens, shorts, touches and via blockages, and wherein at least one of said multiple simple fault mechanisms is dependant upon another of said multiple simple fault mechanisms.

16. The program storage device of claim 12, wherein if said compound fault mechanism comprises a double shorts fault mechanism, then:

said multiple simple fault mechanisms comprises a first level touch, a second level touch, a first level short and a second level short;

said generating comprises generating a first map corresponding to said first level touch and comprising a plurality of first regions, a second maps corresponding to said second level touch and comprising a plurality of second regions, a third map corresponding to said first level shorts and comprising a plurality of third regions, and a fourth map corresponding to said second level shorts and comprising a plurality of fourth region; and said determining of said dominant fault mechanism within a given sub-region comprises applying a first formula if said first level touch and said second level touch involve different nets and a second formula if said first level touch and said second level touch involve a same net, wherein said first formula provides that said dominant fault mechanism comprises that fault mechanism corresponding to a higher of a first region and a second region along said z-axis within said given sub-region, and wherein said second formula provides that said dominant fault mechanism comprises that fault mechanism corresponding to a lower of a higher of a first region and a fourth region along said z-axis within said given sub-region and a higher of a second region and a third region along said z-axis within said given sub-region.

* * * * *